United States Patent [19]

Gaete

[11] Patent Number: 5,741,985
[45] Date of Patent: Apr. 21, 1998

[54] ELECTRONIC ASSEMBLY PALLET

[75] Inventor: Jorge Robinson Gaete, Seabrook, Tex.

[73] Assignee: PFI Vacuum Forming, Inc., Houston, Tex.

[21] Appl. No.: 677,496

[22] Filed: Jul. 10, 1996

[51] Int. Cl.[6] .......................... G01N 15/00; B65G 37/00
[52] U.S. Cl. .................... 73/865.9; 73/1.01; 198/345.3; 198/349
[58] Field of Search ..................... 73/1 R, 866.1, 73/865.9; 198/349, 345.3

[56] References Cited

U.S. PATENT DOCUMENTS

| | | | |
|---|---|---|---|
| 3,854,889 | 12/1974 | Lemelson | 198/349 |
| 4,492,504 | 1/1985 | Hainsworth | 414/273 |
| 4,662,503 | 5/1987 | Lycke | 198/345.3 |
| 4,722,653 | 2/1988 | Williams et al. | 414/222 |
| 5,131,272 | 7/1992 | Minei et al. | 73/1 R |
| 5,297,059 | 3/1994 | Kaeasoe | 73/1 R |
| 5,533,606 | 7/1996 | Yuyama | 198/349 |

*Primary Examiner*—Richard Chilcot
*Assistant Examiner*—Max H. Noori
*Attorney, Agent, or Firm*—Wendy K. Buskop; Chamberlain, Hrolicka et al.

[57] ABSTRACT

A pallet is provided with electrical signal and power connections so that burn-in and other quality assurance testing can be completed without removing the product unit from the pallet. The pallet is also fitted with a memory device that retains inventory and testing information related to the product unit placed on the pallet. The memory device can be read by, or written to, a router at various locations along the assembly process. The router can access the inventory and testing information about the product unit and can write unit-specific instructions to the memory device to redirect the product unit for subsequent unit-specific production operations. The pallet is also provided with electrical, fluid, and gas connections in order to facilitate testing of the product units placed on the pallet.

5 Claims, 4 Drawing Sheets

ELECTRONIC ASSEMBLY PALLET

BACKGROUND OF THE INVENTION

1. Field of the Invention

The present invention relates to pallets for assembly lines. More particularly, the present invention relates to pallets containing electronic and computer enhancements that allow for the storage of pallet inventory in the pallet itself and the ability to locate and direct the pallet anywhere along a production line.

2. Description of the Related Art

Pallets have been used for transporting parts and subassemblies along assembly lines for many years. The typical pallet is either round or rectangular. Most pallets have three or more tabs on the top and three or more corresponding tab recesses on the bottom. The tabs and tab recesses are used for securing a stack of unused pallets, one on top of another, for storage or transport.

Most pallets have a pocket or recess on the top where parts and subassemblies are placed. In some cases, the pallets are provided with pad-eyes and hooks so that loose cargo may be secured onto the pallet with string or wire. Depending upon the application, the pocket can be deep or relatively shallow. In the personal computer manufacturing industry for example, the pocket depth can be relatively shallow because the speed, vibration, and turning rates along the typical production line is relatively benign.

In the production process, a product unit, such as a personal computer, is placed onto the pocket of the pallet. In the prior art production lines, paper documents were also placed into the pocket. The paper documents contained information, such as where the product unit was to be taken and what was to be done with it once it arrived. Testing information, in paper form, regarding the product unit was also placed with the other paper documents in the pocket of the pallet. Unfortunately, loose paper documents are subject to loss or destruction along the assembly line route. This loss or destruction leads to significant economic loss to the manufacturing organization.

During the 1980's, production line processes were automated and computerized. Information regarding the assembly line, such as how long it took to do a particular operation, and the locations where the operations were performed, were placed into large mainframe computers. The mainframe computers, based upon what products were desired at a given rate, would direct assembly line personnel and conveyer mechanisms to move various pallets containing parts and product units along the assembly line.

While some of the control systems of the traditional assembly line have been computerized, the automation of the transportation segment has generally lagged. Partially built product units still travel along conveyer belts. Handling of the paper documents is still performed by hand by humans. Aside from mishandling or misreading by humans, paper documents are also susceptible to being lost or rendered unusable by misuse or misfortune along the assembly line route.

Aside from lost documents, prior art pallets do little more than contain the product unit and allow for easier transportation. While the transportation of product units is important, simple transportation may not be enough to enhance the production process. For example, prior art pallets do not facilitate the "burn-in" process of personal computers. The burn-in process is used to ensure that the components of newly assembled personal computers function properly. In the prior art, the personal computer that was to be burned-in was delivered to a testing station on a pallet. The personal computer plugged into an electric outlet, by hand, for testing. After the burn-in process, the personal computer was then unplugged and sent to another location for repairs or shipment.

The extra activities of handling of product units during burn-in, or other testing purposes, increases production costs for manufacturing organizations. Misreading or loss of paper documents sent with palleted items also increases production costs for manufacturing organizations. Consequently, there is a need in the art for pallets that require less product unit handling. There is also a need in the art for a pallet system that relieves humans from reading and writing paper documents associated with product units on an assembly line. There is also a need in the art for a pallet that can be redirected to various points on the assembly line without human intervention.

SUMMARY OF THE INVENTION

The present invention solves the problems associated with the prior art systems. The present invention consists of a pallet having base with a pocket for securing a personal computer or other electrical appliance. The base (pallet) has terminal connections that correspond to the terminal connections on the personal computer. Instead of physically connecting the personal computer to an electric outlet when then the former is to be burned-in, the burn-in process would take place on the pallet itself. The personal computer would simply be connected to the corresponding terminal connections on the pallet. The pallet itself would have another set of terminals on its base which would transfer, by a wiring harness or other means, the power and signals necessary to facilitate and monitor the burn-in process.

The present invention also contains a memory storage device. The memory storage device is used to retain inventory information about the components that make up the product unit. The memory device can also retain the results of performed production steps, such as a burn-in test. In the preferred embodiment of the present invention, the base is fitted with a read and write terminal which can be accessed by a router device at various locations along the production line. The router device can read the information contained within the storage device and make a determination of where the contents of the pallet should next be sent. The router can also write detailed instructions to the storage device that relate to specific operations to be performed on the product unit at subsequent stages of the production process.

Aside from electrical wiring, the present invention may also incorporate internal tubing for containing and transferring fluids and gases used in the manufacturing process. For example, if the personal computer required cooling water during the burn-in, a cool water tube from the factory could be connected to the pallet, and another cool water tube would be connected from the pallet to the personal computer. Similarly, warm water could be expelled, by a tube, from the personal computer to the pallet and, subsequently, from the pallet to the factory.

DESCRIPTION OF THE PREFERRED EMBODIMENT

Figure 1:
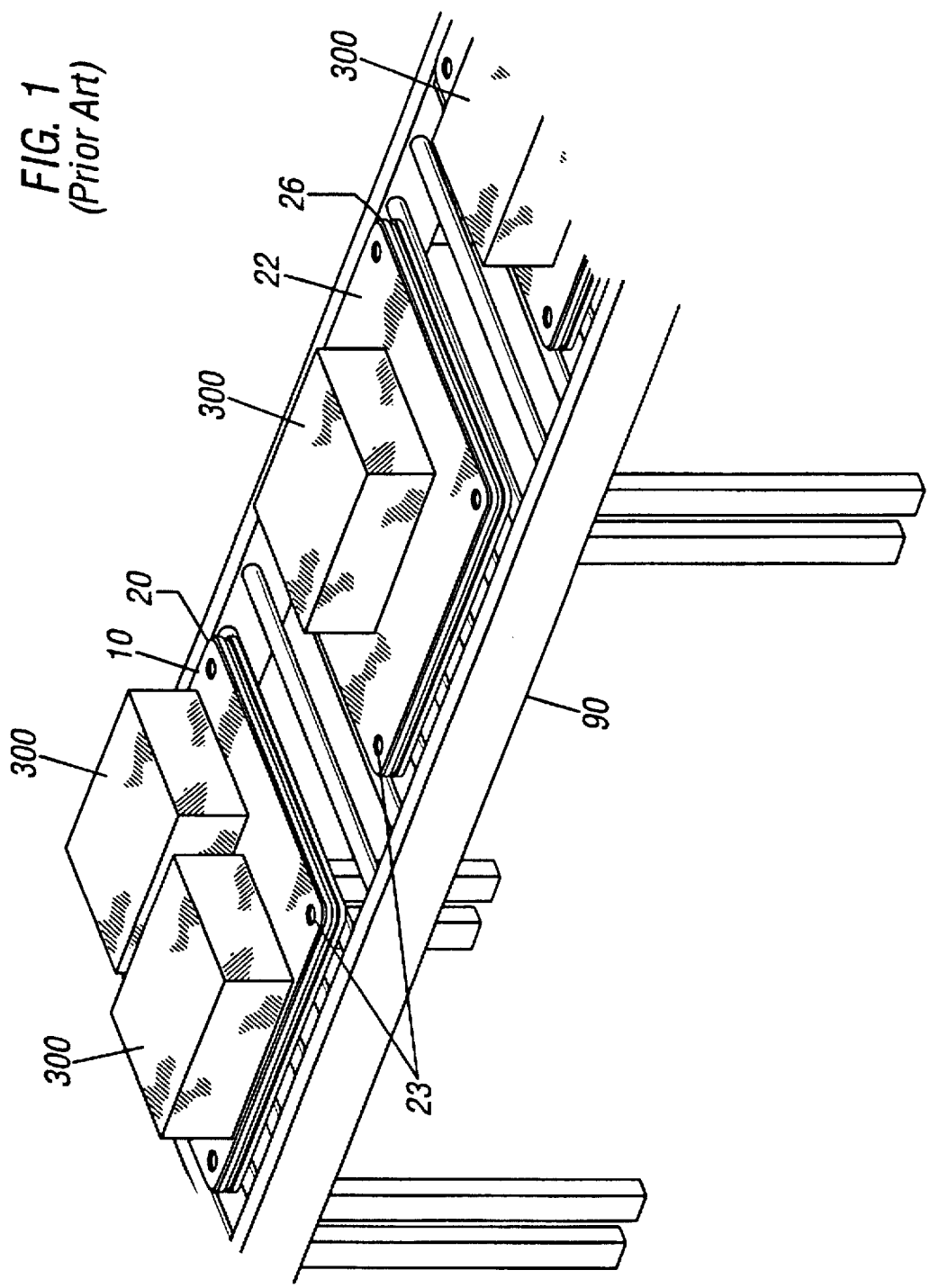
FIG. 1 shows a perspective view of a prior art pallet along a conveyer belt.
Figure 2:
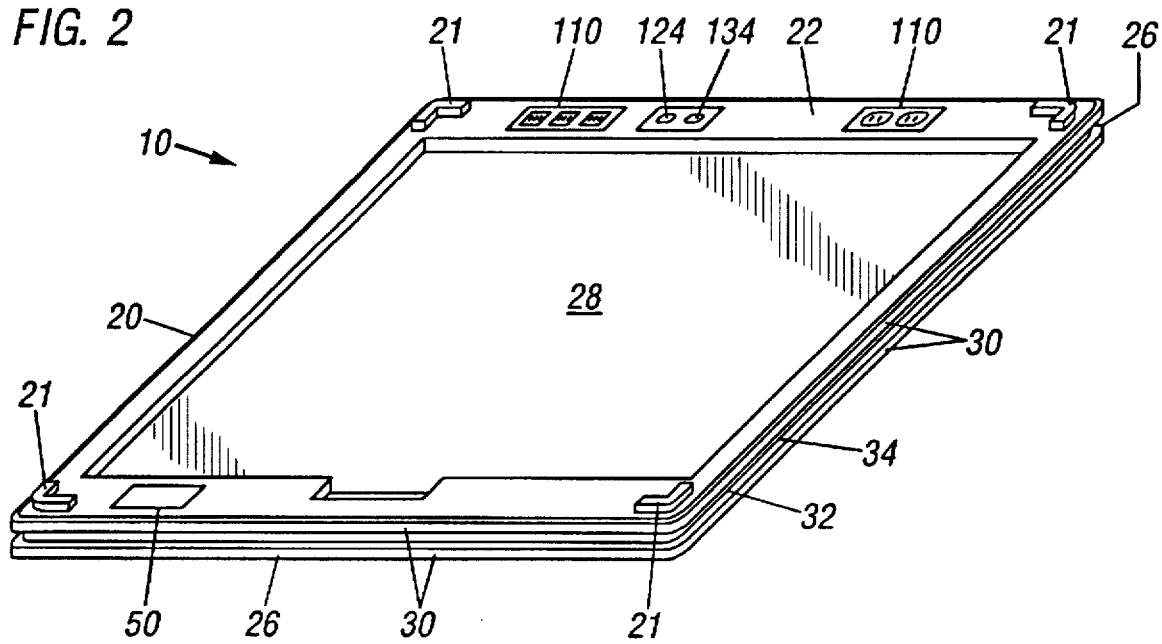
FIG. 2 shows a perspective view of the pallet of the present invention.
Figure 5:
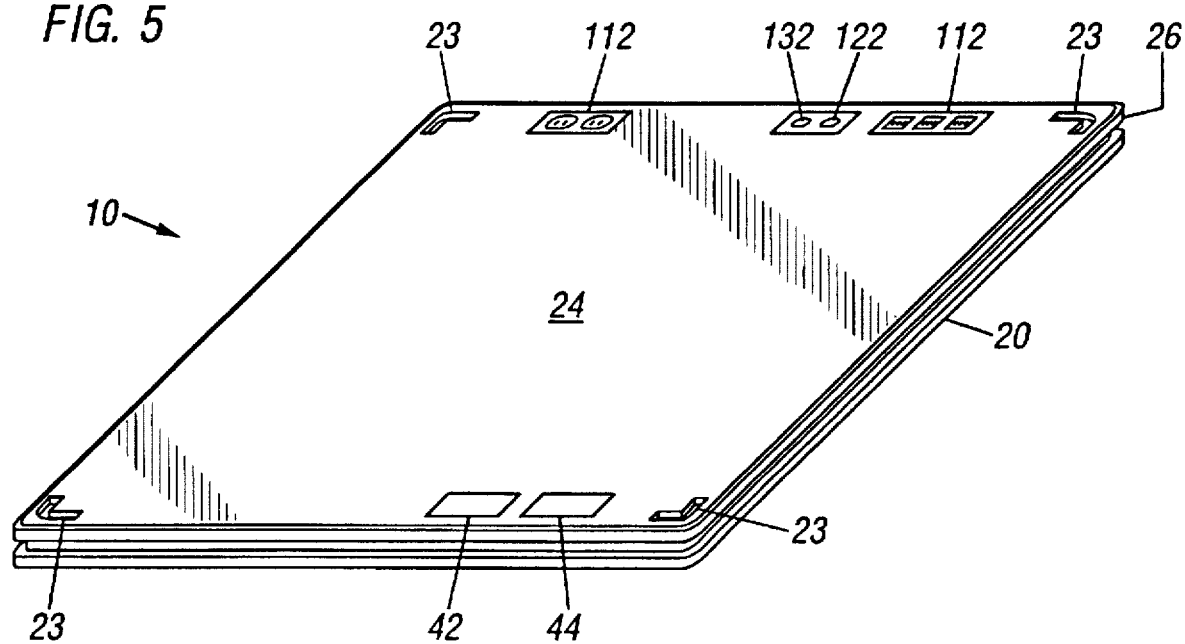
FIG. 5 shows a perspective view of the reader and writer interfaces on the bottom of the pallet of the present invention.

A prior art pallet on a conveyor system 90 is shown in FIG. 1. The prior art pallet 10 has a base 20 and is shown supporting product unit 300. In this instance, prior art pallet 10 has tab recesses 23 on the top 22 of the base 20. The tab recess 23 corresponds to a tab (not shown) on the bottom of the base 20. The tab and tab recess 23 allow unused pallets 10 to be stacked in an orderly manner. It does not matter that the tab be on the top 22 or the bottom, so long as it is done consistently. As shown in FIG. 2 and FIG. 5, in the preferred embodiment of the present invention, the tab 25 is on the top 22 and the tab recess 23 is on the bottom 24.

Figure 3:
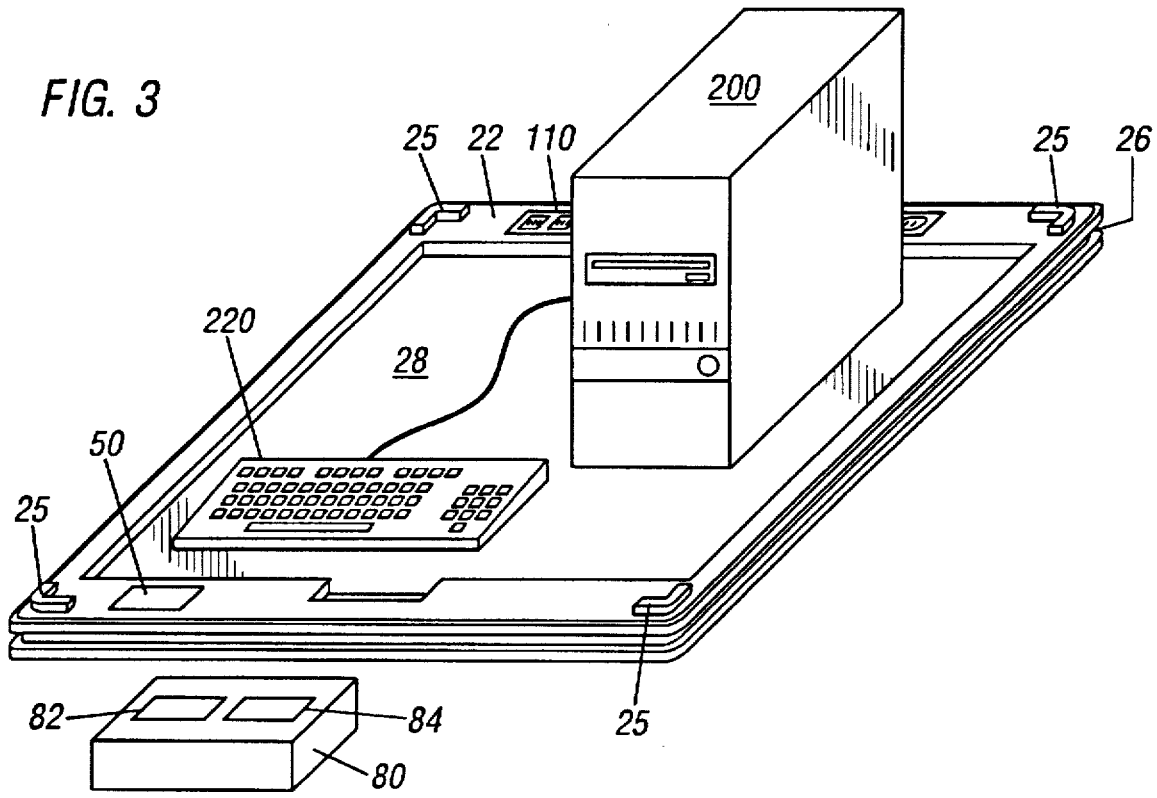
FIG. 3 shows a perspective view of a personal computer on the pallet of the present invention.

A top perspective view of the preferred embodiment of the present invention is shown in FIG. 2. The pallet 10 has a base 20, the shape and thickness of which may be modified to fit the particular need. In most cases, the base is either rectangular (as shown in FIG. 2) or round. The base 20 has a top 22. In the center of top 22 there is a pocket 28 in which the particular product units are to be placed. Again, the width and depth of the pocket 28 can be modified to fit the particular need. As shown in FIG. 2, pallet 10 has four sides 26. In the preferred embodiment of the present invention, the sides 26 have two guiding ribs 30. The guiding ribs 30 form a guiding slot 32 on sides 26. The guiding ribs 30 and guiding slot 32 are used to enhance the handling characteristics of the pallet 10 along the assembly line. FIG. 3 shows a loaded pallet 10 with a personal computer 200 secured onto pocket 28.

Figure 7:
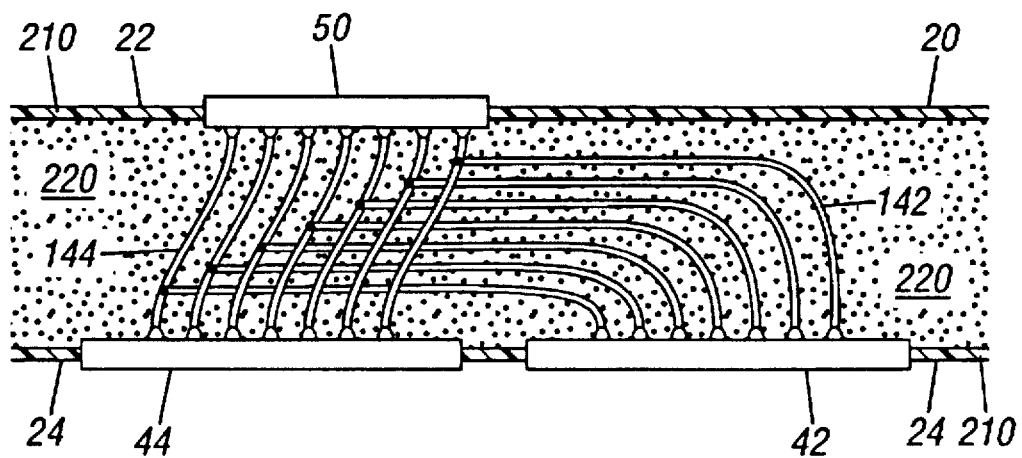
FIG. 7 shows a partial sectional side view of the internal wiring and storage memory of the pallet of the present invention.

In the preferred embodiment of the present invention, the pallet 10 has a storage memory 50 embedded into the base 20. The storage memory 50 may be a dynamic random access memory (DRAM) or it may be an electronically erasable-programmable read only memory (EEPROM), depending upon the requirements of the end user. If a DRAM is used, a power source is necessary and a suitable battery, such as a nickel-cadmium (Ni-Cad) or other suitable batter power source, may be included with the storage memory 50. The storage memory 50 must, of course, have sufficient memory capacity to handle all storage of inventory, testing, routing and any other necessary information for the product unit contained within pocket 28. As shown in FIG. 5, the bottom 24 of pallet 10 is fitted with a read terminal 42 and a write terminal 44. As shown in FIG. 7, the memory 50 is connected to the read terminal 42 and the write terminal 44 by read wires 142 and write wires 144, respectively. Although physical electrical connections can be used between the read terminal 42, write terminal 44, and the assembly line router 80, shown in FIG. 3, the preferred embodiment of the present invention uses infrared (optical) means for writing data to and reading data from the router 80 and the pallet 10. Specifically, router 80 is fitted with infrared write terminal 82 and read terminal 84 that correspond to infrared read terminal 42 and write terminal 44 of the pallet 10, respectively. Depending upon the particular circumstances of the assembly line operation, a single, combined read-write terminal may be substituted for the separate read terminal 42 and write terminal 44 and router write terminal 82 and read terminal 84. The advantage of using an infrared (optical) system for reading and writing to the memory 50 is that the human or mechanical handler of the pallet 10 need only get the various terminals (42/82 and 44/84) only in close proximity to each other without having to make a precise, physical connection that would be required with a standard electrical connector.

Figure 6:
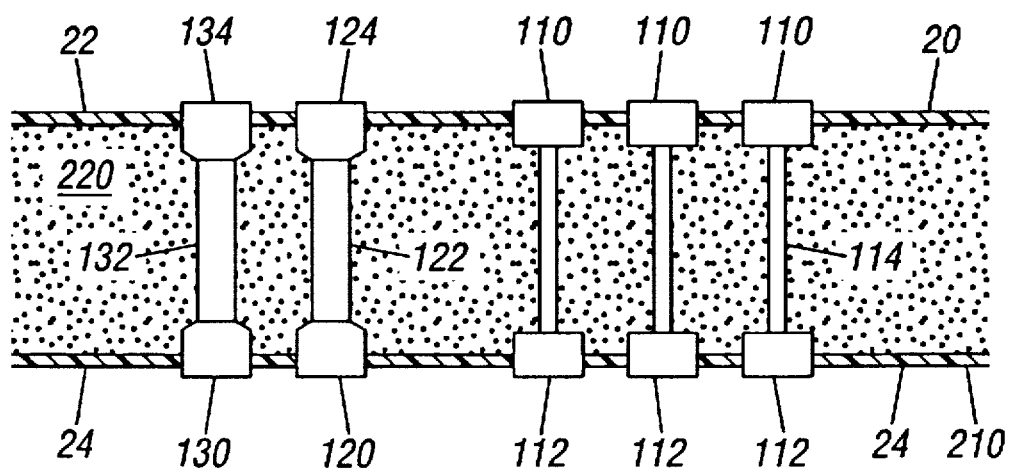
FIG. 6 shows a partial sectional side view of the internal wiring and conduits of the pallet of the present invention.

As shown in FIG. 2, the periphery of top 22 is fitted with several connection terminals. The various connections are used for testing of the electrical appliance, such as a personal computer, that is placed on pallet 10. In the preferred embodiment of the present invention, the top 22 of pallet 10 is fitted with a plurality of electrical connections 110, a fluid connection fitting 124, and a gas connection fitting 134. As shown in FIG. 5, the top connections have corresponding bottom connections. For example, top electrical connections 110 have a corresponding bottom electrical connection 112. Similarly, top fluid connection fitting 124 has a corresponding bottom fluid connection fitting 120 and top gas connection fitting 134 has a corresponding bottom gas connection fitting 130. As shown in FIG. 6, each of the top fittings or connection terminals is connected to the bottom fittings or connection terminals by tubes or wires. In the preferred embodiment of the present invention, top electrical connections 110 are connected to bottom electrical connections 112 by wires 114. Top fluid connection fitting 124 is connected to bottom fluid connection fitting 120 by fluid container 122. Similarly, top gas connection fitting 134 is connected to bottom gas connection fitting 130 by gas container 132. In the preferred embodiment of the present invention, the fluid container 122 and the gas container 132 are made of PVC tubing. The wires 122, 132, and 114 can be made of copper, aluminum, or any other suitable conducting material. It is also possible to substitute fiberoptic cable for wires 122, 132, and 114. Although FIG. 6 and FIG. 7 show relatively linear top-to-bottom connections between the various connection fittings and terminals, it will be understood to those of ordinary skill in the art that the wires and tubes may be arranged in a wide variety of ways within base 20 to ensure proper positioning of the top and bottom fittings and terminal connections.

Figure 4:
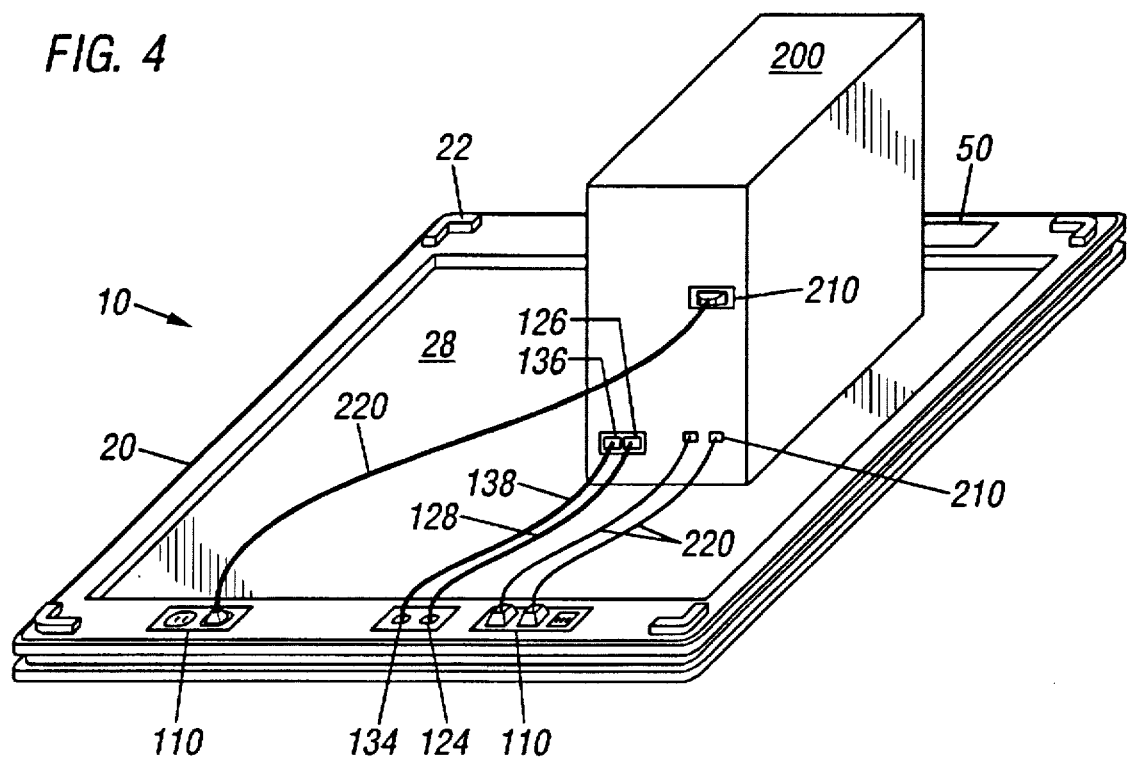
FIG. 4 shows a perspective view of the back side of a personal computer connected to the pallet of the present invention.

FIG. 4 shows the utility of the connections and fittings on the pallet 10. In this instance, a personal computer 200 is undergoing burn-in testing. Power, modem, and sound card electrical connections 210 are connected to pallet 10 terminal connections 110 by wires 220. If a cooling fluid is necessary, proper connections between the personal computer 200 fluid fitting 126 and the pallet 10 top fluid connection fitting 124 can be made using tubing 128. Similarly, if a cooling gas is needed, proper connections between the personal computer 200 gas fitting 136 and the pallet 10 top gas connection fitting 134 can be made using tubing 138.

Information regarding the results of tests, or routing information for past and subsequent production operations can be stored in storage memory 50. For example, data can be written from an assembly line router 80 to memory 50 by sending, in the preferred embodiment of the present invention, proper infrared signals to the read terminal 42. Similarly, the router 80 can obtain information from storage memory 50 by receiving signals from the write terminal 44.

As shown in FIG. 6 and FIG. 7, the base 20 is made of urethane foam interior 220 with an ABS plastic exterior shell 210. The exterior shell 210 coating of the base can be anti-static, fire retardant, electrically conducting, and/or static dissipative. However, depending upon the particular application for pallet 10, the exterior shell 210 may not need to be coated with any of the above fire or static inhibitors.

Although the present invention has been characterized in terms of the above-described presently preferred embodiment, it will be recognized by those skilled in the art who have the benefit of this disclosure that certain changes and variations may be made to that embodiment without departing from the spirit of the present invention. The present invention is not limited to the above-described presently preferred embodiment, and it is expected that such variations will be encompassed within the scope of the following claims.

What is claimed is:

1. A pallet comprising:
   a base, said base having a top and a bottom, said top of said base having a pocket for placing articles onto said pallet, said base further having at least one side;
   guiding means for guiding said pallet along a predetermined path on an assembly line, said guiding means attached to each of said sides of said base;
   tracking means for determining the location of said pallet along said assembly line, said tracking means embedded within said base; and
   testing means for testing articles on said pallet, said testing means comprises a fluid container and two fluid connection fittings, said fluid container and said fluid fittings constructed and arranged to contain and to transfer a fluid, said fluid used to test said article placed on said pallet.

2. A pallet comprising:
   a base, said base having a top and a bottom, said top of said base having a pocket for placing articles onto said pallet, said base further having at least one side:
   guiding means for guiding said pallet along a predetermined path on an assembly line, said guiding means attached to each of said sides of said base;
   tracking means for determining the location of said pallet along said assembly line, said tracking means embedded within said base; and
   testing means for testing articles on said pallet, said testing means comprises a gas container and two gas connection fittings, said gas container and said gas fittings constructed and arranged to contain and to transfer a gas, said gas used to test said article placed on said pallet.

3. A pallet comprising:
   a base, said base having a top and a bottom, said top of said base having a pocket for placing articles onto said pallet, said base further having at least one side;
   guiding means for guiding said pallet along a predetermined path on an assembly line, said guiding means attached to each of said sides of said base;
   tracking means for determining the location of said pallet along said assembly line, said tracking means embedded within said base, said tracking means comprises a storage memory, a wiring harness, a read terminal, and a write terminal, said tracking means used to receive, to store, and to transmit signals relating to the location and production operations for said pallet; and
   testing means for testing articles on said pallet.

4. A pallet comprising:
   a base, said base having a top and a bottom, said top of said base having a pocket for placing articles onto said pallet, said base further having at least one side;
   guiding means for guiding said pallet along a predetermined path on an assembly line, said guiding means attached to each of said sides of said base;
   tracking means for determining the location of said pallet along said assembly line, said tracking means embedded within said base, said tracking means comprises:
      a memory, said memory used to store signals relating to the inventory of contents on said pallet,
      a reader, said reader used to read signals from a reader terminal into said memory, and
      a writer, said writer used to write signals from said memory to a writer terminal;
      a wiring harness, said wiring harness having a read wire and a write wire, said read wire connecting said reader terminal to said memory, said writer wire connecting said writer terminal to said memory; and
   testing means for testing articles on said pallet;
   wherein a router on an assembly line can access said reader terminal on said pallet and read present location and inventory signals from said memory, said router can also access said writer terminal to write signals related to future location of said pallet to said memory so that said pallet will be directed to a certain location according to said signals stored in said memory.

5. A pallet comprising:
   a base, said base having a top, a bottom, and at least one side, said top of said base having a pocket for securing a personal computer onto said pallet, said personal computer having connection terminals for components within said personal computer;
   at least one base terminal connection embedded in said base for connecting said components of said personal computer to sufficient power sources and test signals so that said personal computer can be burned-in while said personal computer is secured on said pallet;
   a memory, said memory used to store signals relating to the inventory and burn-in results of said components of said personal computer secured on said pallet;
   a reader, said reader used to read signals from a reader terminal into said memory;
   a writer, said writer used to write signals from said memory to a writer terminal; and
   a wiring harness, said wiring harness having at least one read wire and at least one write wire, said read wire connecting said reader terminal to said memory, said writer wire connecting said writer terminal to said memory wherein a router on an assembly line can access said reader terminal on said pallet and read the present location, inventory information, and burn-in results from said memory, said router can also access said writer terminal to write future location information to said memory so that said pallet will be directed to a certain location according to said signals stored in said memory.

* * * * *